(12) United States Patent
Chua-Eoan et al.

(10) Patent No.: US 8,295,082 B2
(45) Date of Patent: Oct. 23, 2012

(54) GATE LEVEL RECONFIGURABLE MAGNETIC LOGIC

(75) Inventors: Lew G. Chua-Eoan, San Diego, CA (US); Xiaochun Zhu, San Diego, CA (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 673 days.

(21) Appl. No.: 12/192,386

(22) Filed: Aug. 15, 2008

(65) Prior Publication Data

US 2010/0039136 A1 Feb. 18, 2010

(51) Int. Cl.
*G11C 11/14* (2006.01)
*H03K 19/177* (2006.01)
(52) U.S. Cl. .......................................... 365/171; 326/39
(58) Field of Classification Search ............... 326/37–41; 365/171
See application file for complete search history.

(56) References Cited

U.S. PATENT DOCUMENTS

| | | | |
|---|---|---|---|
| 6,034,887 A * | 3/2000 | Gupta et al. ................. | 365/171 |
| 6,249,453 B1 | 6/2001 | You | |
| 7,728,622 B2 * | 6/2010 | Chua-Eoan et al. ............ | 326/40 |
| 7,852,663 B2 * | 12/2010 | Xi et al. ......................... | 365/158 |
| 7,894,228 B2 * | 2/2011 | Nozieres et al. ................ | 365/50 |
| 2007/0103964 A1 * | 5/2007 | Kim et al. ....................... | 365/148 |
| 2008/0247222 A1 * | 10/2008 | Jung et al. ...................... | 365/158 |
| 2010/0258887 A1 * | 10/2010 | Zhu et al. ....................... | 257/421 |
| 2010/0302838 A1 * | 12/2010 | Wang et al. .................... | 365/158 |

FOREIGN PATENT DOCUMENTS

WO 2008121973 10/2008

OTHER PUBLICATIONS

International Search Report—PCT/US2009/053885, International Search Authority—European Patent Office Dec. 3, 2009.
Written Opinion—PCT/US2009/053885, International Search Authority—European Patent Office Dec. 3, 2009.
Zhao W et al: "Integration of Spin-Richard Alan Moore technology in FPGA circuits" Solid-State and Integrated Circuit Technology, 2006. ICSICT '06. 8th, International Conference on, IEEE, Oct. 1, 2006, pp. 799-802, XP031045719, ISBN: 978-1-4244-0160-4 abstract paragraph [0003].

* cited by examiner

*Primary Examiner* — Shawki S Ismail
*Assistant Examiner* — Dylan White
(74) *Attorney, Agent, or Firm* — Nicholas J. Pauley; Peter Michael Kamarchik; Jonathan T. Velasco

(57) ABSTRACT

A re-programmable gate logic includes a plurality of non-volatile re-configurable resistance state-based memory circuits in parallel, wherein the circuits are re-configurable to implement or change a selected gate logic, and the plurality of non-volatile re-configurable resistance state-based memory circuits are each adapted to receive a logical input signal. An evaluation switch in series with the plurality of parallel non-volatile re-configurable resistance state-based memory circuits is configured to provide an output signal based on the programmed states of the memory circuits. A sensor is configured to receive the output signal and provide a logical output signal on the basis of the output signal and a reference signal provided to the sensor. The reconfigurable logic may be implemented based on using spin torque transfer (STT) magnetic tunnel junction (MTJ) magnetoresistance random access memory (MRAM) as the re-programmable memory elements. The logic configuration is retained without power.

21 Claims, 10 Drawing Sheets

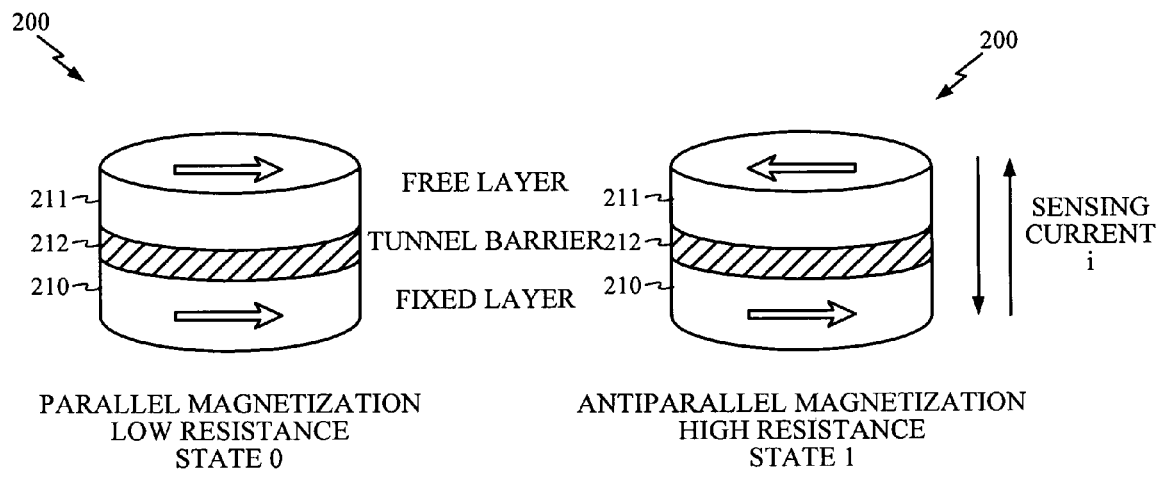
FIG. 2A  FIG. 2B

GATE LEVEL RECONFIGURABLE MAGNETIC LOGIC

TECHNICAL FIELD

This disclosure relates to programmable logic, and more specifically to reprogrammable logic using spin transfer torque magnetoresistance random access memory (STT MRAM).

BACKGROUND

A programmable logic array (PLA) is a programmable device used to implement combinational logic circuits. The PLA has a set of programmable AND planes, which link to a set of programmable OR planes, which can then be conditionally complemented to produce an output. This layout allows for a large number of logic functions to be synthesized, including XOR or more complex combinational functions. Many PLAs are mask-programmed during manufacture in the same manner as a ROM. This is particularly true of PLAs that are embedded in more complex and numerous integrated circuits such as microprocessors. PLAs that can be programmed after manufacture are called FPLAs (field-programmable PLAs) or FPGAs (field-programmable gate arrays). FPGA interconnects can be programmed (i.e., "burned in") only once by the customer or designer, after the FPGA is manufactured, to implement any logical function-hence the name "field-programmable". FPGAs are usually slower and may draw more power than their application-specific integrated circuit (ASIC) counterparts.

With FPGA, there is a considerable portion of chip space either dedicated to overhead or which is unused. For example, to accommodate a specific application requiring a particular choice or mix of AND and OR gate logic, both must be available in a generic chip, and only those components required for the application are wired, or "burned-in" at programming time.

Magnetoresistance random access memory (MRAM) is a memory element base on the tunneling resistance of an oxide sandwiched between two magnetic layers. When the magnetization in the two layers are parallel, the tunneling resistance is "low," and this is referred to as a State 0. When the magnetization in the two layers are anti-parallel, the tunneling resistance is "high," and this is referred to as a State 1. In an MRAM, one layer is fixed for the life of the device, and the other is a "free" layer that can be changed with addressable write lines to generate a magnetic field capable of realigning, or "flipping," the polarization direction. The State 0 or 1 can be determined by measuring the resistance of the MRAM with a voltage divider circuit relative to a known reference resistance. The State of the MRAM, while being re-writable, is non-volatile, and therefore requires no power to be sustained.

MRAM memory, however, requires switching power levels that are not compatible with battery powered portable devices, and does not scale well as is currently being required in increasingly higher device pitch density.

Presently, logic circuitry does not exist that provides re-programmable logic within a fixed topological configuration of cells relying on non-volatile magnetic memory-type elements. Based on the foregoing, those skilled in the art will appreciate that a need exists for a system providing non-volatile and reconfigurable (i.e., reprogrammable) logic that is scalable to higher device pitch density.

BRIEF SUMMARY

A reprogrammable logic device and method of forming is disclosed based on using spin torque transfer (STT) MRAM elements to implement the logic function. STT MRAM is used to replace the conventional FPGA or PLA devices to implement logic such as, for example, OR gate, AND gate, NOR gate and NAND gate functions. The configuration of the logic can be changed to provide a different set of logic operations by reprogramming the state of the STT MRAM elements without a need to change the topology. Furthermore, the logic configuration is retained when powered off, and comes back in the same configuration when powered on.

An STT MRAM element is a junction comprising a sandwich of a magnetic film, oxide film, and magnetic film, in an elliptically shaped structure, similar to conventional MRAM, but may be scaled to much smaller dimension. Like conventional MRAM, STT MRAM has a fixed layer and a free (write-programmable) layer of magnetic film. The free layer is programmed by means of spin torque transfer of the electron spin polarization of the write current going directly through the junction, rather than by an magnetic field induced by external currents. A further advantage of STT MRAM over conventional MRAM is provided by the lower write current required in the smaller sized device, while enabling a higher current density through the junction, making the write-programming step more efficient and producing a desired State ("1" or "0") more reliably.

Whereas the embodiments presented herein are described with respect to magnetic random access memory, and more particularly spin torque transfer magnetoresistance tunnel junction magnetic random access memory, the features described can be contemplated as being applied as well to such devices including phase-change random access memory (PCRAM), resistance-based random access memory (R-RAM), or any device that can store a resistance-based electrically programmable memory state in a non-volatile manner, i.e., in the absence of sustaining power, which is reprogrammable to a plurality of states, whether by electrical, magnetic, electromagnetic (e.g., optical), or a combination of such physical effects.

The foregoing has outlined rather broadly the features and technical advantages of the present disclosure in order that the detailed description of the disclosure that follows may be better understood. Additional features and advantages of the disclosure will be described hereinafter which form the subject of the claims of the invention. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present invention, reference is now made to the following descriptions taken in conjunction with the accompanying drawings, in which:

FIG. 2A shows the basic elements of a conventional magnetic tunnel junction MTJ in a parallel magnetization low resistance state;

FIG. 2B shows the basic elements of a conventional magnetic tunnel junction MTJ in an anti-parallel magnetization high resistance state;

DETAILED DESCRIPTION

A logic gate array structure is disclosed based on STT MTJ MRAM cells that can be programmably reconfigured to provide non-volatile AND, NAND, OR and NOR logic functionality. Similar reprogrammable logic functionality may be achieved using other forms of reprogrammable memory elements as indicated above, and are within the intended spirit of the disclosure. However, STT MTJ MRAM is described herein as an exemplary embodiment for ease of description, and is not limiting.

The MTJ has the property that the resistance of electron current flow through the junction can be altered by changing the relative magnetization direction of one ("free") magnetic layer separated from a second "fixed" magnetic layer by a thin non-conducting oxide layer. The resistance is determined by the ability of electrons to tunnel through the oxide. When the two magnetic layers are magnetized parallel the resistance is "low" (State 0) When the two magnetic layers are magnetized anti-parallel, the resistance is "high" (State 1). In STT MTJs the resistance state of the junction can be switched by writing the desired magnetization direction to the free layer by sending a high current of sufficient density of spin polarized electrons directly through the junction. The current is sufficient to affect the free layer but not the fixed layer.

Figure 1:
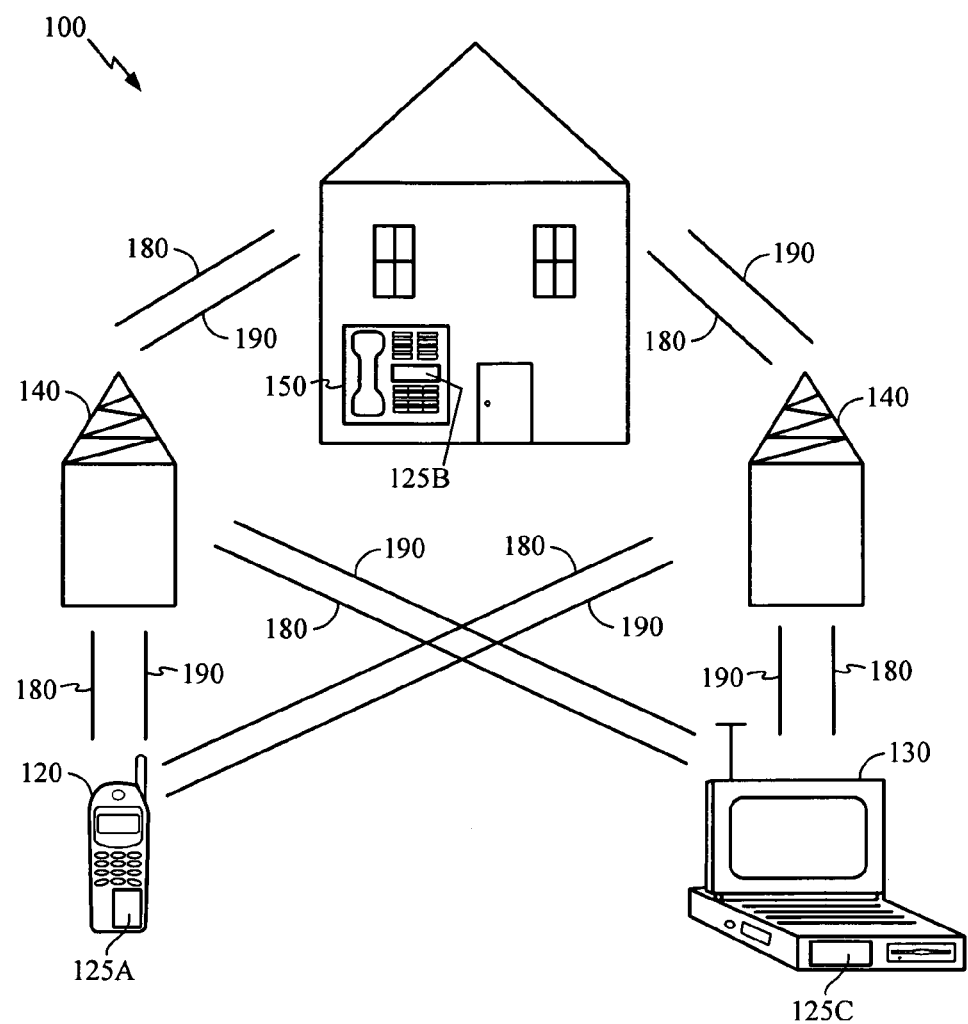
FIG. 1 shows an exemplary wireless communication system in which embodiments of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include STT MTJ MRAM memory chips 125A, 125B and 125C, which is an embodiment of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the invention, the invention is not limited to these exemplary illustrated units. Embodiments of the disclosure may be suitably employed in any device which includes a memory chip.

FIG. 2 shows the basic elements of a magnetic tunnel junction MTJ 200. FIG. 2A shows the basic elements of a conventional magnetic tunnel junction MTJ in a parallel magnitization low resistance state. FIG. 2B shows the basic elements of a conventional magnetic tunnel junction MTJ in an anti-parallel magnitization high resistance state. MTJ 200 comprises a fixed magnetization layer (i.e., fixed layer 210), a free layer 211 and a barrier layer 212. Fixed layer 210 is a magnetic layer having a fixed direction of magnetization for the life of the device. Free layer 211 is a magnetic layer where the direction of magnetization can be altered by the direction of an applied tunneling write current. Barrier layer 212 is a dielectric layer thin enough to permit tunneling of electrons from either fixed layer 210 or free layer 211 depending on conditions described below. Barrier layer 212 may be one or more of a number of insulator materials, such as an oxide, e.g., MgO. Typically, the stack of fixed layer 210, barrier layer 212 and free layer 211 may be shaped in the form of an planar ellipsoid, with the polarization directions preferentially and substantially along the major axis of the ellipsoid, and parallel to the surface of the substrate on which the stack is formed.

This configuration may substantially apply to conventional MRAM as well as STT MTJ MRAM, with the difference that, for STT MTJ MRAM no external magnetic field is required to write the polarization state to MTJ 201.

Figure 3A:
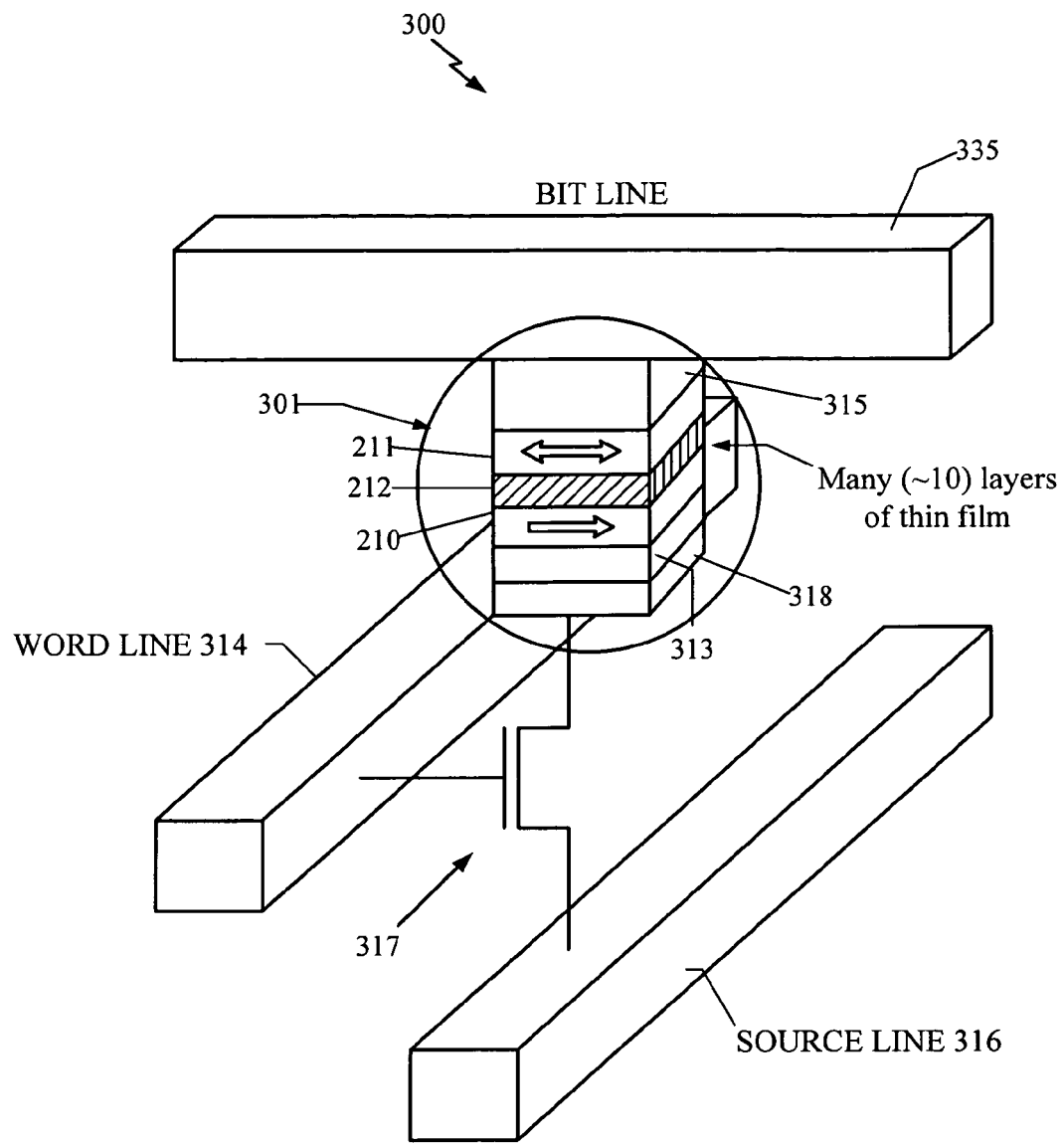
FIG. 3A shows an STT MTJ MRAM cell in a 1-transistor/1-MTJ (1-T/1-MTJ) configuration according to an embodiment of the disclosure.

FIG. 3A shows an MRAM circuit 300 (e.g., STT MTJ) in a 1-transistor/1-MTJ (1-T/1-MTJ) configuration including a junction MTJ 301. MTJ 301 has fixed layer 210 adjacent to an anti-ferromagnet 313, which is conductive and retains its magnetization for the life of the device. Anti-ferromagnet 313 determines the alignment of the magnetic polarization of fixed layer 210. In addition, MTJ 301 has an electrode 318 adjacent to antiferromagnet 313 and electrode 315 adjacent to free layer 211 for connection to external circuitry. Through electrode 318, MTJ 301 is connected to a drain electrode of a transistor 317. A source electrode of transistor 317 is connected to a source line 316. A gate electrode of transistor 317 is connected to a word line 314. Word line 314 controls the gate of transistor 317. Bit line 335 and source line 316 set the direction of electron flow. Free layer 211 of MTJ 301 is connected to a bit line 335. A voltage $V_{DD}$ (of either polarity) is applied between bit line 335 and source line 316. Transistor 317 acts a switch. When a voltage is applied via word line 314 to the gate of transistor 317, current will flow between bit line 335 and source line 316, as regulated by the tunneling resistance across barrier 212, which depends on the STT induced polarization of free layer 211.

In a write mode, $V_{DD}$ is made large enough to generate a flow of spin polarized electrons of a sufficient current density to switch the magnetization of free layer 211. The electron current flow direction through the MTJ 301 determines the induced polarization direction in free layer 211. In a read mode, $V_{DD}$ is smaller, and the current density is insufficient to alter the polarization in free layer 211.

Figure 3B:
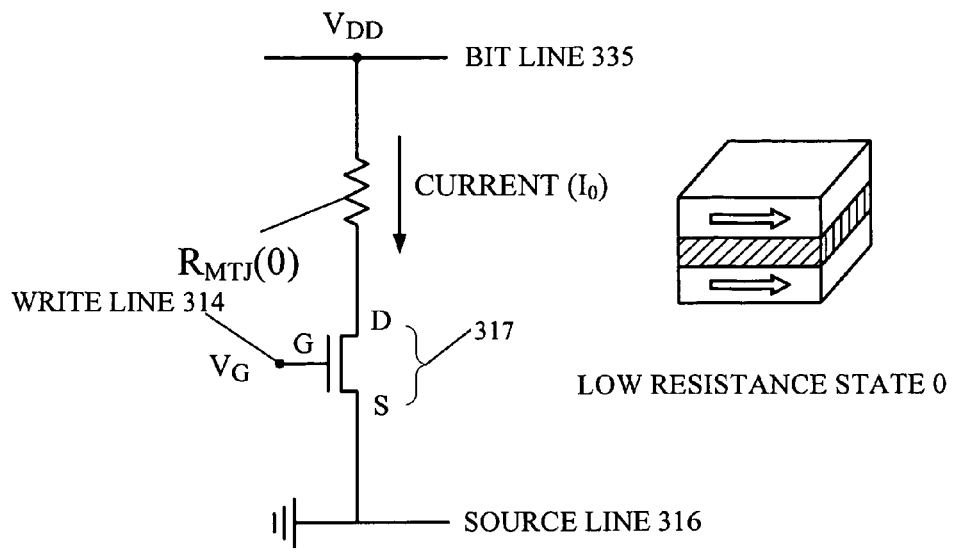
FIG. 3B illustrates an exemplary circuit configuration for programming an MTJ for a low resistance parallel polarization state in accordance with the architecture of FIG. 3A.
Figure 3C:
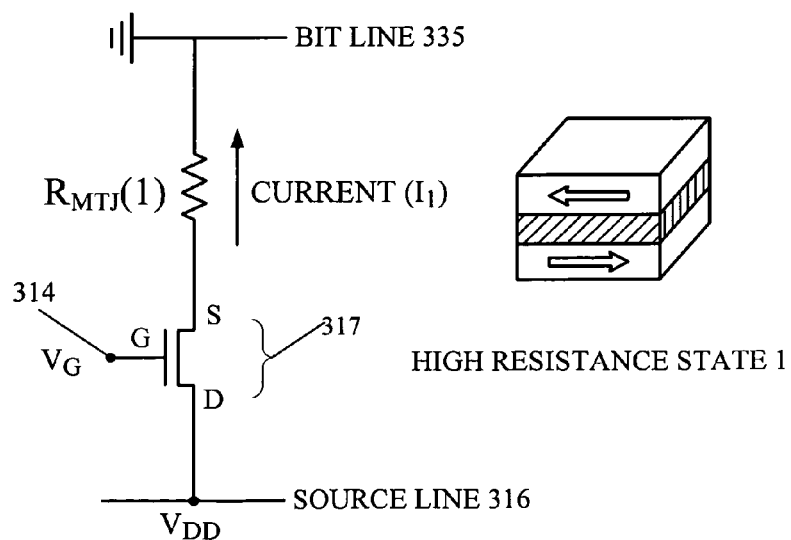
FIG. 3C illustrates an exemplary circuit configuration for programming an MTJ for a high resistance anti-parallel polarization state in accordance with the architecture of FIG. 3A.

In FIG. 3B the bit line 335 voltage is set to is $V_{DD}$ (assumed positive) and the source line 316 goes to ground so that the conventional current flows from the bit line 335 to source line 316 (i.e., electrons flow from source line 316 to bit line 1335) when the word line 314 provides a gate voltage $V_G$ to turn on the conductive path of transistor 317. When $V_{DD}$ is large enough, current flow in this direction writes free layer 211 to a polarization parallel with fixed layer 210, placing MTJ 301 in a low resistance State (0), having a resistance $R_{MTJ}(0)$. In FIG. 3C, when the gate to transistor 317 is turned on by asserting word line 314 with the voltage $V_G$, by setting the source line 316 high at $V_{DD}$, and by setting the bit line 335 voltage lower, electrons flow in the reverse direction from bit line 335 to source line 316, i.e., from the free layer 211 to the fixed layer 210, switching the free layer 211 to the antiparallel polarization state, placing MTJ 301 in a high resistance State (1) with resistance $R_{MTJ}(1) > R_{MTJ}(0)$.

As described below, an STT MRAM MTJ may be used as a gate logic element such as can be used in a gate logic where every such gate logic element may be reprogrammed. Thus, a device that includes such reprogrammable logic may be dynamically reconfigured in response to write instructions to support the requirements of a specific application. This reusability of programmable logic space permits very efficient use of chip space. Furthermore, the logic program is non-volatile, i.e., requires no stand-by power.

Figure 4A:
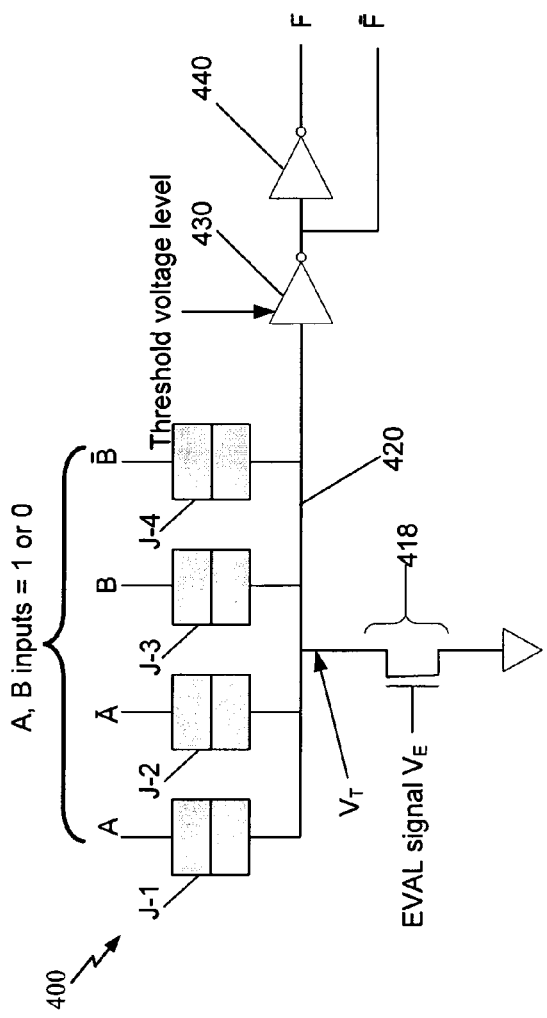
FIG. 4A is an example of a four-input logic circuit using four STT MTJ cells according to an embodiment of the disclosure.

FIG. 4A is an example of a four-input gate logic 400 using four STT MTJ junctions J-1 to J-4 according to an embodiment of the disclosure. FIG. 4A shows only the junctions J-1 to J-4, but each may also include a separate transistor (not shown) switchable by a word line signal to the transistor gate, in the manner indicated in FIG. 3A. It is similar to a conventional FPGA four-input logic block, except that the state and corresponding resistance of each cell may be reconfigured, as described above. In reality, only two inputs may be required, e.g., A and B. Additional inverters (not shown) can provide two additional parallel inputs A_ and B_.

In read mode, i.e., during a logic operation, inputs, which may be identified as A, A_, B, and B_ are applied to junctions J-1 to J-4, respectively, where, if A=1, then A_=0, etc. The voltage levels of these logic inputs are less than the write voltages, so that the magnetization resistance states of junctions J-1 to J-4 are not changed. Each junction may be in a 0 or a 1 state. Thus, junction J-N(0) is in a "0" state, and J-N"(1) is in a "1" state.

When an input [A, A_, B, and B_] is applied to J-1 to J-4, respectively, and an EVAL signal voltage $V_E$ is applied to the gate of a transistor switch 417, an amount of current will flow through transistor switch 417. The amount of current is determined by the voltage of the input signals [A, A_, B, and B_] (assumed here, for exemplary purposes to be $V_{DD}$ or 0, where $V_{DD}$ is at a read-only level, and does not cause a change in polarization, as indicated above), the effective resistances of junctions J-1 to J-4 and an effective resistance $R_T$ of transistor 417. The effective resistances of junctions J-1 to J-4 are in parallel, and the effective net parallel resistance of junctions J-1 to J-4 is in series with $R_T$ of transistor 417. An input to A and/or B=1 may be high (e.g., voltage=$V_{DD}$), or the input may be A and/or B=0 (e.g., voltage=0). A voltage $V_T$ measured across transistor switch 417, measured at a summing line 420, is input to a sensor circuit that may comprise, for example, two saturated amplifying inverters 430 and 440, which may be used to determine a truth table of logical outputs F and F_ for the applied signals, as described below.

Figure 4B:
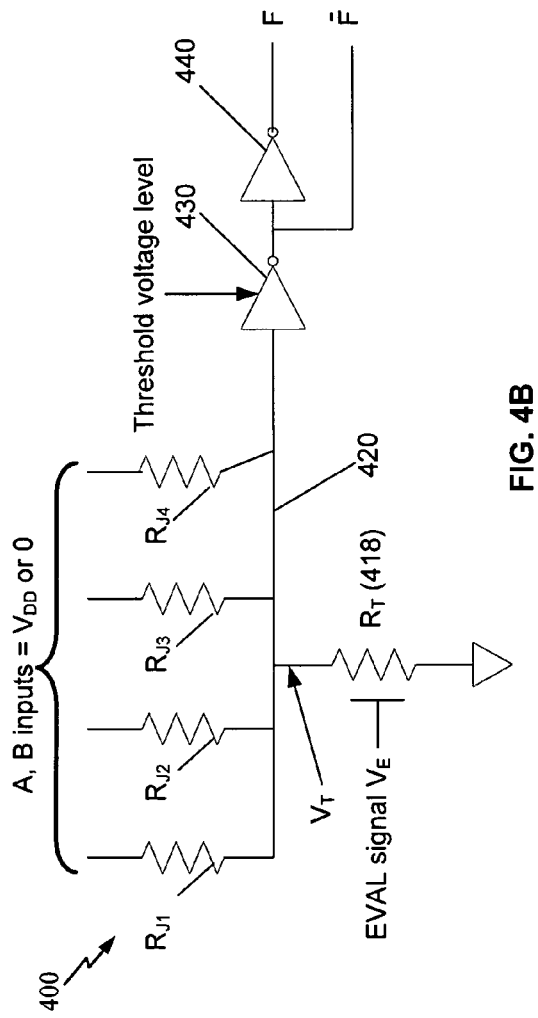
FIG. 4B is an equivalent circuit for the exemplary logic circuit of FIG. 4A.

FIG. 4B is an equivalent circuit for the exemplary logic circuit of FIG. 4A. Junctions J-1 to J-4 may be represented by their respective equivalent resistances $R_{J-1}$-$R_{J-4}$, and transistor switch 417 represented by an equivalent resistance $R_T(418)$ when EVAL voltage $V_E$ turns transistor switch 417 on to a conducting state. The sum of all currents flowing through junctions J-1 to J-4, e.g., $I_T$, flows through summing line 420 to transistor switch 418, and then to ground. A voltage $V_T$ at summing line 420 determines the total current according to $V_T = I_T \times R$.

Corresponding to each state, junctions J-1 to J-4 may have an effective resistance $R_{J-1}$ to $R_{J-4}$, where $R_{J-N}(0)$ is the resistance of junction J-N in the 0 state, which is a "low" resistance, and $R_{J-N}(1)$ is the resistance of junction J-N' in the 1 state, which is a "high" resistance. To illustrate how various logic functions can be reconfigurably implemented using the topology of FIG. 4A, examples are presented by way of referring to the equivalent circuit of FIG. 4B. For simplicity, the following assumptions are made with respect to the values of $R_{J-N}(0)$, $R_{J-N}(1)$, and $R_T$ and the voltage levels of inputs A and B:

Let $R_{J-N}(0) = R_0$, $R_{J-N}(1) = 5*R_0$, and $R_T(418) = R_0/10$. These resistance values may include parasitic resistance (e.g., line and junction switch resistance), and may be treated effectively as composite resistance values determining the electrical response of the elements.

Let: $V_A$ and/or $V_B = V_{DD}$ when A and/or B is set=1, where $V_{DD}$ is a read level voltage.

Let: $V_A$ and/or $V_B = 0$ when A and/or B is set=0.

EXAMPLE 1

Assume the MTJ junctions J1-J4 are set to the states [1,0, 1,0]. Therefore, the corresponding resistances are $R_{J-1}(1) = 5R_0$, $R_{J-2}(0) = R_0$, $R_{J-3}(1) = 5R_0$, and $R_{J-4}(0) = R_0$. For all four possible combinations of A,B and the resulting four input voltages [A, _A, B, _B] of magnitude $V_{DD}$ the measured voltage $V_T$ are shown in Table I.

TABLE 1

Transistor voltage $V_T$ for junction states [1, 0, 1, 0] versus inputs A, B

| A | A_ | B | B_ | $V_T/V_{DD}$ |
|---|----|---|----|--------------|
| 1 | 0  | 1 | 0  | 0.18         |
| 1 | 0  | 0 | 1  | 0.42         |
| 0 | 1  | 1 | 0  | 0.42         |
| 0 | 1  | 0 | 1  | 0.67         |

Figure 5A:
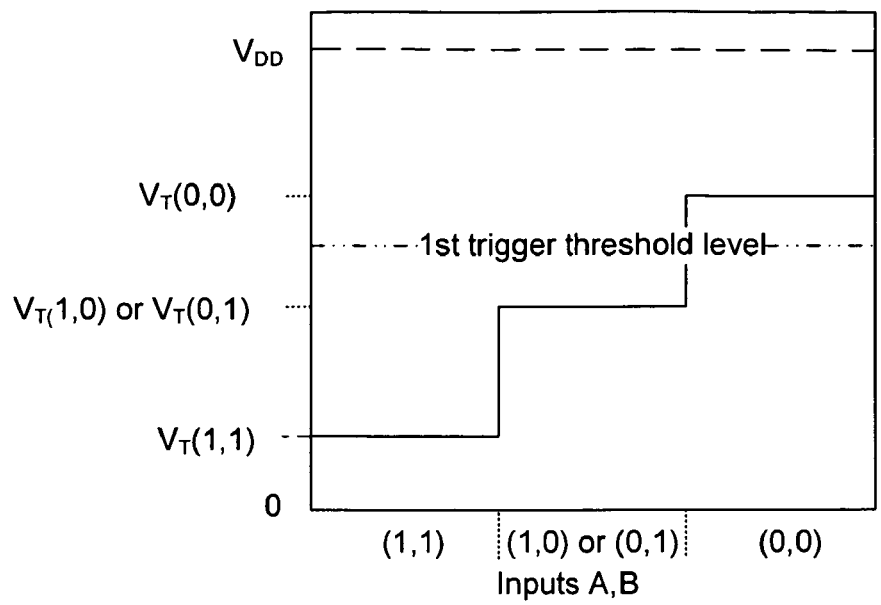
FIG. 5A is a voltage output for an exemplary [1,0,1,0] state setting for the four STT MTJ cells of FIGS. 3-4.

FIG. 5A is a representative plot of voltage output $V_T(A,B)$ for the possible combinations of inputs shown in Table 1, given that the state settings for the four STT MTJ junctions J-1 to J-4 are [1,0,1,0]. The output voltage may be indexed relative to the input states A,B, i.e., as $V_T(A,B)$. Inverter 420 receives the voltage $V_T(A,B)$ from summing line 420. Inverter 430 may be set to trigger an output if $V_T(A,B)$ exceeds the a threshold voltage. Inverter 430 then may amplify the input to output a logical 1 or 0 level (e.g., $V_{DD}$ or 0) depending on the input. Second inverter 440 inverts the output of inverter 430. F is the output from inverter 440 and F_ is the output from inverter 430. If inverter 430 is set to trigger based on a threshold voltage between $V_T(1,0)$ and $V_T(0,0)$, the truth table in Table 2 results. As shown in Table 1, $V_T(1,0)$ =$V_T(0,1)$. It can be seen that the F is identical to a logical NOR and F_ is identical to a logical OR.

TABLE 2

Truth Table for junction states [1, 0, 1, 0] versus inputs A, B
Threshold voltage set between $V_T(1, 0)$ and $V_T(0, 0)$

| A | B | F | _F |
|---|---|---|----|
| 1 | 1 | 0 | 1 |
| 1 | 0 | 0 | 1 |
| 0 | 1 | 0 | 1 |
| 0 | 0 | 1 | 0 |
|   |   | NOR | OR |

Figure 5B:
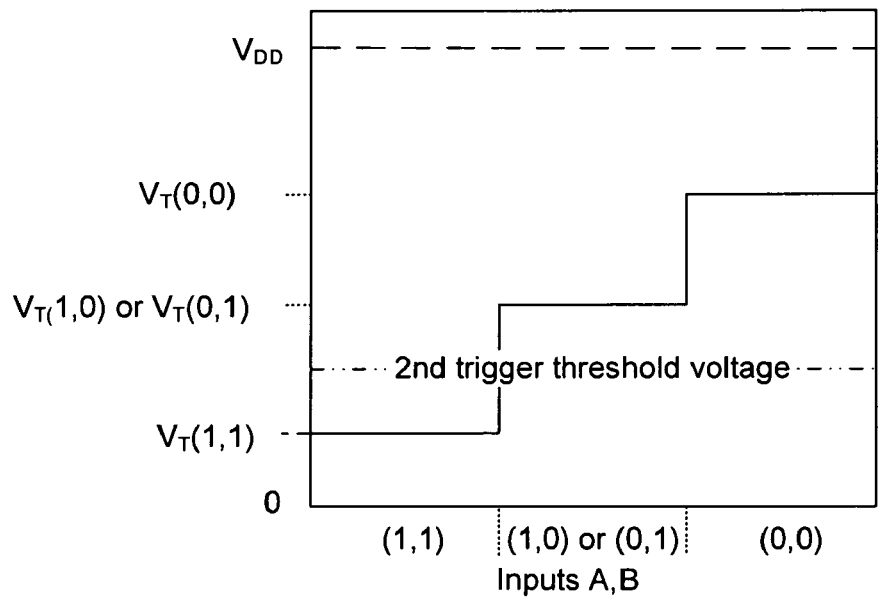
FIG. 5B is a voltage output for an exemplary [0,1,0,1] state setting for the four STT MTJ cells of FIGS. 3-4.

If, alternatively, inverter 430 is set to trigger based on a threshold voltage between $V_T(1,1)$ and $V_T(1,0)$, the input and output values can are illustrated in FIG. 5B and the numerical representations are represented in the truth table Table 3. It can be seen by inspection that F obeys NAND logic and F_ obeys AND logic.

It can be seen, therefore, by a combination of MTJ junctions set to [1,01,0] and controlling the threshold voltage to inverter 430, that the four logic functions AND, NAND, OR, and NOR may be accomplished. In the next example, the MTJ junctions may be reconfigured to different resistance states and the resulting logic determined by inspection.

TABLE 3

Truth Table for junction states [1, 0, 1, 0] versus inputs A, B,
Threshold voltage set between $V_T(1, 1)$ and $V_T(1, 0)$

| A | B | F | _F |
|---|---|---|----|
| 1 | 1 | 0 | 1 |
| 1 | 0 | 1 | 0 |
| 0 | 1 | 1 | 0 |
| 0 | 0 | 1 | 0 |
|   |   | NAND | AND |

EXAMPLE 2

Figure 5C:
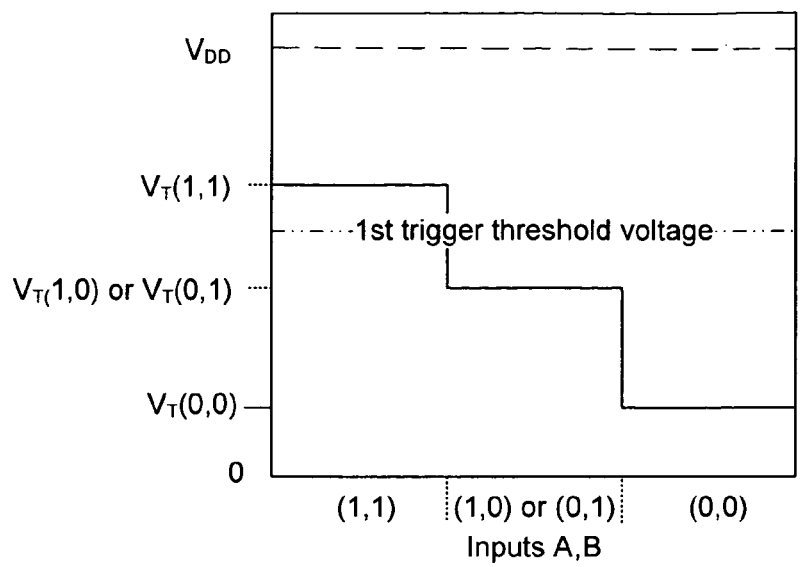
FIG. 5C is a voltage output for an exemplary state setting for the four STT MTJ cells of FIGS. 3-4.

Assume the MTJ junctions J-1 to J-4 are set to the states [0,1,0,1]. Therefore, the corresponding resistances are $R_{J-1}(0)=R_0$, $R_{J-2}(1)=5R_0$, $R_{J-3}(0)=R_0$, and $R_{J-4}(1)=5R_0$. Using the same analysis as above, FIG. 5C is a representative plot of voltage output $V_T(A,B)$ for the possible combinations of inputs, given that the state settings for the four STT MTJ junctions J-1 to J-4 are [0,1,0,1]. Note that $V_T(1,1)$ is the highest output, as compared to the first example, where $V_T(0,0)$ was highest. If inverter 430 is set to trigger between $V_T(1,1)$ and $V_T(1,0)$ and output $V_{DD}$ or 0 accordingly, the truth table in Table 4 results. It can be seen that F is identical to a logical AND, and F_ is identical to a logical NAND.

TABLE 4

Truth Table for junction states [0, 1, 0, 1] versus inputs A, B,
Threshold voltage set between $VT(1, 1)$ and $V_T(1, 0)$

| A | B | F | F_ |
|---|---|---|----|
| 1 | 1 | 1 | 0 |
| 1 | 0 | 0 | 1 |
| 0 | 1 | 0 | 1 |
| 0 | 0 | 0 | 1 |
|   |   | AND | NAND |

Figure 5D:
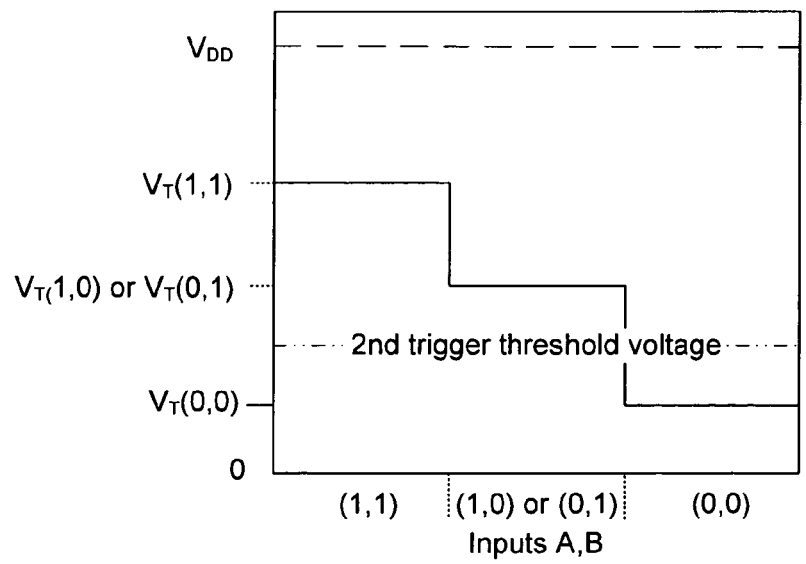
FIG. 5D is a voltage output for an exemplary state setting for the four STT MTJ cells of FIGS. 3-4.

Similarly, if inverter 430 is set to trigger based on a threshold voltage between $V_T(1,0)$ and $V_T(0,0)$, the input and output values can are illustrated in FIG. 5D and the numerical representations are represented in the truth table Table 5. It can be seen that the F is identical to a logical OR and F_ is identical to a logical NOR.

TABLE 5

Truth Table for junction states [0, 1, 0, 1] versus inputs A, B
Threshold voltage set between $V_T(1, 0)$ and $V_T(0, 0)$

| A | B | F | F_ |
|---|---|---|----|
| 1 | 1 | 1 | 0 |
| 1 | 0 | 1 | 0 |
| 0 | 1 | 1 | 0 |
| 0 | 0 | 0 | 1 |
|   |   | OR | NOR |

Additional configurations may be arranged using MTJ junctions to achieve reprogrammable non-volatile logic. For example, Transistor 417 may be replaced with an MTJ junction in series with the parallel array of MTJ junctions J-1 to J-4. MTJ junction may be substantially the same as described with reference to FIG. 3A, but functions here in the role of a switch with a programmable resistance. The inverters 430 and 440 function as a sensor, as described above, triggering logical outputs on the basis of the threshold voltage level provided to inverter 430 and the detected voltage $V_T$ developed substantially at a bit line 335 corresponding to the MTJ switch, in the same manner that $V_T$ was developed at the drain of transistor 417, described above. The MTJ switch may then be programmed to two different resistance states, which has the effect of shifting and scaling the voltages $V_T(A,B)$. Thus, the logical outputs may be further controlled by shifting the output voltage levels and scaling range relative to the threshold voltage level by using an MTJ switch.

Alternatively, a combination of transistor switches and MTJ switches may be arranged in series and/or parallel configurations to provide a finer degree of control of output voltages relative to the trigger threshold level. It can be appreciated that this combination enables performance leveling between logic circuits that may have variations in, for example, effective resistance of elements due to manufacturing tolerances.

Figure 6:
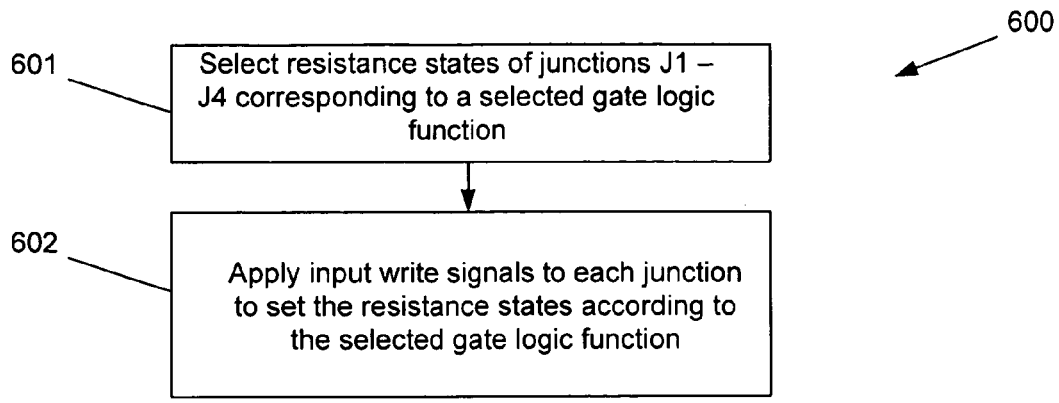
FIG. 6 is a flow diagram of a method of programmably configured gate logic according to an embodiment of the disclosure.

FIG. 6 is flow diagram of a method of programmably configuring gate logic according to an embodiment of the disclosure. Method 600 begins with a first step (P601) of selecting resistance states of each MTJ junction, e.g., J1-J4, in gate logic 400 corresponding to a selected logic function behavior that gate logic 400 is desired to obey. Then an appropriate write signal level $V_{DD}$ of sufficient magnitude to set the resistance state of the MTJ is applied to each MTJ J1-J4 (P602). The polarity of $V_{DD}$ and therefore, the direction of current, may determine the resistance state accordingly.

Figure 7:
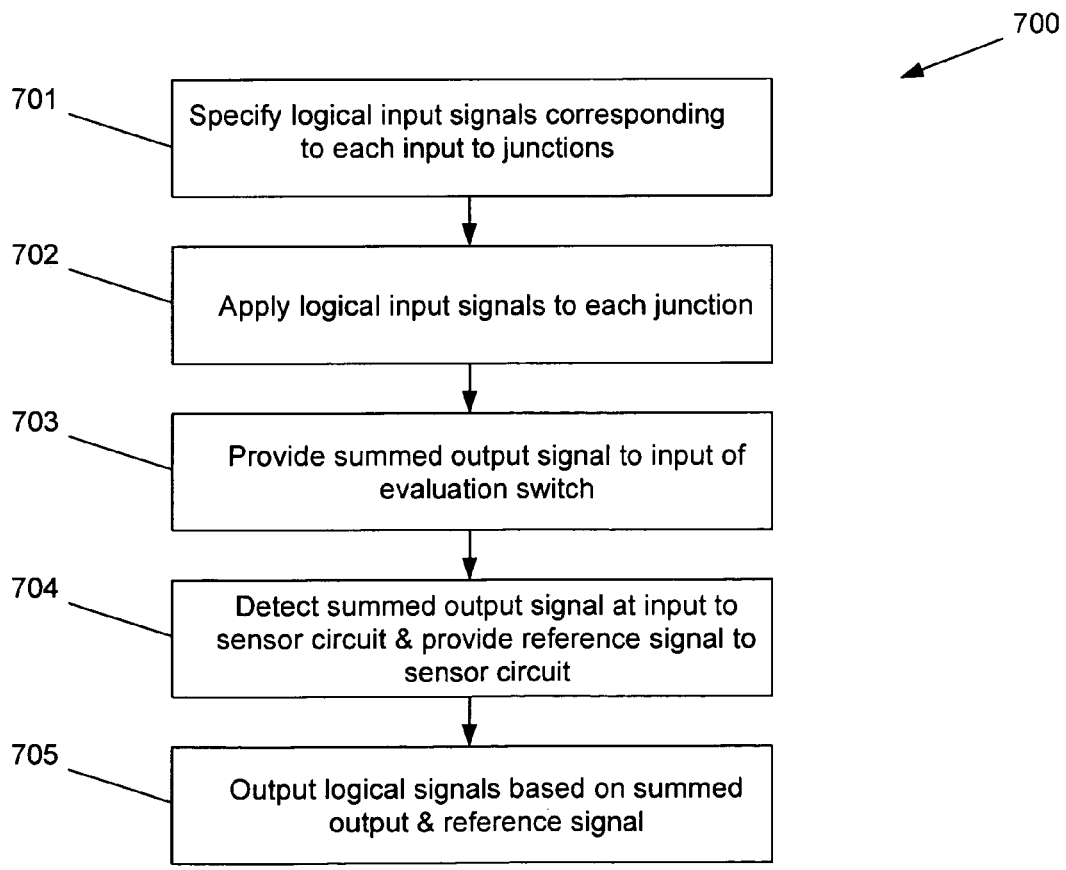
FIG. 7 is flow diagram of a method of programmably configuring gate logic according to an embodiment of the disclosure.

FIG. 7 is a flow diagram of a method of operating a reconfigurable gate logic according to an embodiment of the disclosure. Method 700 begins with specifying the logical (i.e., 0 or 1) input signals to be applied to the inputs of each MTJ, e.g., J1-J4, in gate logic 400 (P701). The magnitude of the logical input signal levels are not sufficient to change the resistance state of MTJs J1-J4. The logical input signals are applied to the respective junction inputs (P702). According to the equivalent circuit analysis of FIG. 4B, the summed of the currents passing through MTJs J1-J4, in passing through evaluation switch 418, generates a voltage signal output that appears at the input to evaluation switch 418 (P703). The detected voltage signal output is input to the sensor circuit, comprised of inverters 430 and 440. Inverter also receives a voltage reference signal which determines the logical output of inverter 430 depending on the detected voltage signal appearing at its input (P704). Inverters 430 and 440 output respective logical output signals based on the detected voltage signal and the voltage reference signal (P705). Therefore, the combination of configured states of MTJs J1-J4 and the reference voltage provided to inverter 430 determine the logical output of the logical inputs.

Figure 8:
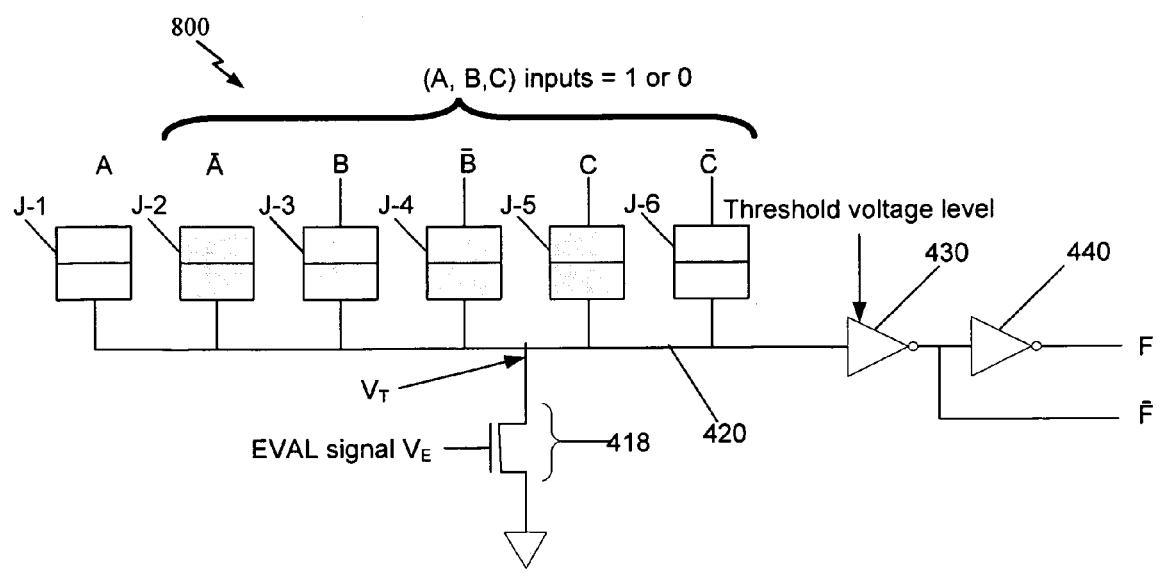
FIG. 8 is an example of a four-input logic circuit using four STT MTJ cells according to an embodiment of the disclosure.

FIG. 8 is an example of a four-input gate logic 800 using four STT MTJ junctions J-1 to J-4 according to an embodiment of the disclosure. FIG. 8 shows only the junctions J-1 to J4, but each may also include a separate transistor (not shown) switchable by a word line signal to the transistor gate, in the manner indicated in FIG. 3A. It is similar to a conventional FPGA four-input logic block, except that the state and corresponding resistance of each cell may be reconfigured, as described above. In this example, only three inputs may be required, e.g., A, B, and C. Additional inverters (not shown) can provide three additional parallel inputs A_, B_, and C_.

In read mode, i.e., during a logic operation, inputs, which may be identified as A, A_, B, B_, C and C_are applied to junctions J-1 to J-4, respectively, where, if A =1, then A_ =0, etc. The voltage levels of these logic inputs are less than the write voltages, so that the magnetization resistance states of junctions J1 to J-4 are not changed. Each junction may be in a 0 or a 1 state. Thus, junction J-N(0) is in a "0 " state, and J-N'(1) is in a "1" state.

When an input [A, A_, B, B_, C, and C_] is applied to J-1 to J-4, respectively, and an EVAL signal voltage $V_E$ is applied to the gate of a transistor switch 418, an amount of current will flow through transistor switch 417. The amount of current is determined by the voltage of the input signals [A, A_, B, B_, C, and C_] (assumed here, for exemplary purposes to be $V_{DD}$ or 0, where $V_{DD}$ is at a read-only level, and does not cause a change in polarization, as indicated above), the effective resistances of junctions J-1 to J-4 and an effective resistance $R_T$ of transistor 417. The effective resistances of junctions J-1 to J-4 are in parallel, and the effective net parallel resistance of junctions J-1 to J-4 is in series with $R_T$ of transistor 418. An input to A, B and/or C =1 may be high (e.g., voltage =$V_{DD}$), or the input may be A, B and/or C =0( e.g., voltage =0). A voltage $V_T$ measured across transistor switch 418, measured at a summing line 420, is input to a sensor circuit that may comprise, for example, two saturated amplifying inverters 430 and 440, which may be used to determine a truth table of logical outputs F and F_for the applied signals, as described below.

A reference to FIG. 4B would demonstrate an equivalent circuit for the exemplary logic circuit of FIG. 8, with the exception that now there are three inputs (A,B,C) as opposed to just two (A,B). Junctions J-1 to J-4 may be represented by their respective equivalent resistances $R_{j-1}$- $R_{j-4}$, and transistor switch 417 represented by an equivalent resistance $R_T$(418) when EVAL voltage $V_E$ turns transistor switch 417 on to a conducting state. The sum of all currents flowing through junctions J-1 to J-4, e.g., $I_T$, flows through summing line 420 to transistor switch 418, and then to ground. A voltage $V_T$ at summing line 420 determines the total current according to $V_T = I_T \times R_T$.

Corresponding to each state, junctions J-1 to J-4 may have an effective resistance $R_{j-1}$ to $R_{j-4}$, where $R_{j-N}(0)$ is the resistance of junction J-N in the 0state, which is a "low" resistance, and $R_{j-N'}(1)$ is the resistance of junction J-N' in the 1state, which is a "high" resistance. To illustrate how various logic functions can be reconfigurably implemented using the topology of FIG. 8, examples are presented by way of referring to the equivalent circuit of FIG. 4B. For simplicity, the following assumptions are made with respect to the values of $R_{j-N}(0)$, $R_{j-N'}(1)$, and $R_T$ and the voltage levels of inputs A, B and C:

Let $R_{j-N}(0)=R_0$, $R_{j-N'}(1)=5*R_0$, and $R_T(418)=R_0/10$. These resistance values may include parasitic resistance (e.g., line and junction switch resistance), and may be treated effectively as composite resistance values determining the electrical response of the elements.

Let: $V_A$, $V_B$ and/or $V_C=V_{DD}$ when A , B and/or C is set =1, where $V_{DD}$ is a read level voltage.

Let: $V_A$, $V_B$ and/or $V_C$=0when A, B and/or C is set =0.

Figure 9A:
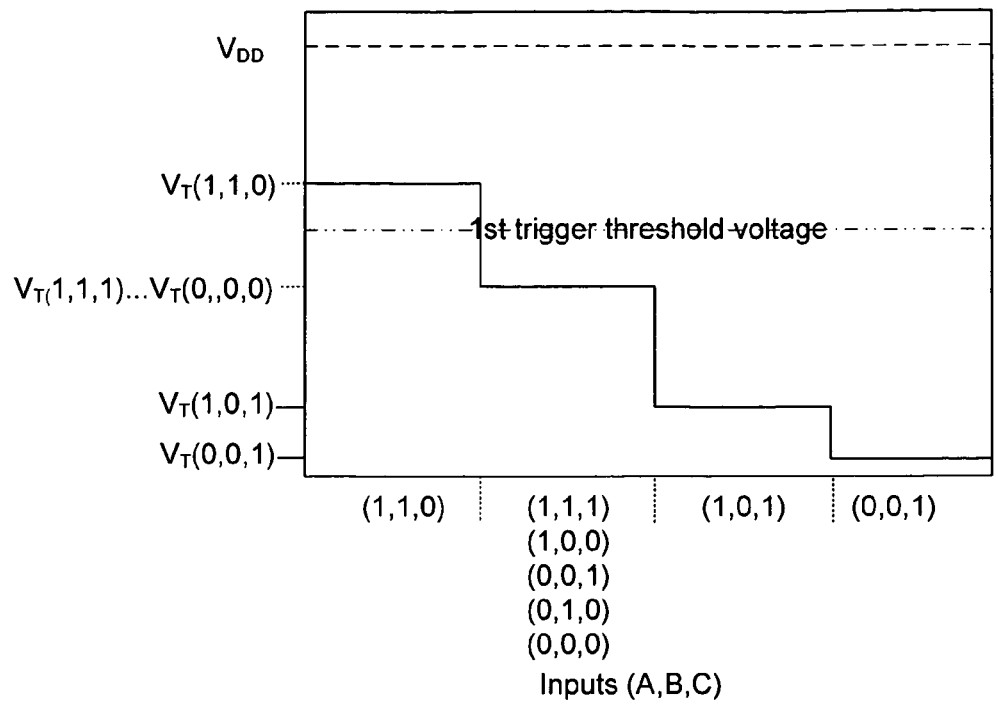
FIG. 9A is a voltage output for an exemplary state setting for the four STT MTJ cells.
Figure 9B:
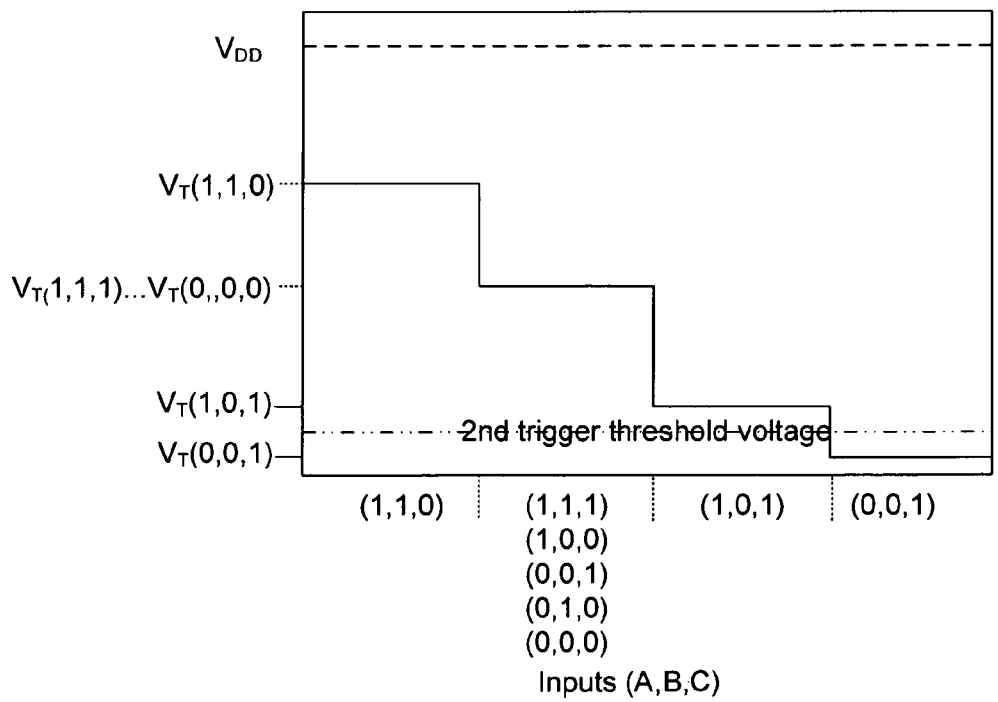
FIG. 9B is a voltage output for an exemplary state setting for the four STT MTJ cells.

Example 1 as illustrated by FIGS. 9A and 9B

Assume the MTJ junctions J1 - J4 are set to the states [1,0,1,0]. Therefore, the corresponding resistances are $R_{j-1}(1)$ =$5R_0$, $R_{j-2}(0)$ =$R_0$, $R_{j-3}(1)$ =$5R_0$, and $R_{j-4}(0)$ =$R_0$.

FIG. 9A is a representative plot of voltage output $V_T$(A,B, C) for the possible combinations of inputs, given that the state settings for the four STT MTJ junctions J-1 to J-4 are [1,0,1, 0]. The output voltage may be indexed relative to the input states A,B and C, i.e., as $V_T$(A,B,C). Inverter 420 receives the voltage $V_T$(A,B,C) from summing line 420. Inverter 430 may be set to trigger an output if $V_T$(A,B,C) exceeds the a threshold voltage. Inverter 430 then may amplify the input to output a logical 1 or 0 level (e.g., $V_{DD}$ or 0) depending on the input. Second inverter 440 inverts the output of inverter 430. F is the output from inverter 440 and F is the output from inverter 430.

FIG. 9B is a representative plot of voltage output $V_T$(A,B, C) for the possible combinations of inputs, given that the state settings for the four STT MTJ junctions J-1 to J-4 are [0,1,0, 1]. Note that $V_T$(1,1,0) is the highest output.

As one of ordinary skill in the art of programmable logic array design will recognize, more complex logic functions (e.g., XOR, XNOR, etc.) may be realized by combining the basic logical operations provided by the logic circuit of FIG. 4A when cells of MTJ junctions are suitably programmed. It can be further appreciated that more complex logic functions may be accomplished. For example, more that four inputs may be configured with a like number of STT MTJ cells to obtain logical function behavior depending on the state of each cell and the trigger level.

Therefore, it can be appreciated by one of ordinary skill in the art of programmable logic array design that the STT MTJ junctions described above may be combined into arrays of cells comprising gate logic to implement the same functionality as FPGAs and related PLAs with a high degree of re-programmability control. Look up tables (LUTs) that are the equivalent of the truth tables described above is an example of such implementation. Furthermore, it can be appreciated that such gate logic arrays for the purpose of performing complex logical operations may also be reprogrammed as needed, i.e., each of the junctions in the plurality of the cells may be reconfigurably switched between two states, so that different logical processes may be realized from the same array.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile re-programmable gate logic comprising:
a non-volatile resistance-based memory cell comprising a sensor circuit configured to receive a selected threshold voltage and to output a first logical signal corresponding to a first logical functionality of the non-volatile resistance-based memory cell in response to the selected threshold voltage being a first threshold voltage, and to output a second logical signal corresponding to a second logical functionality of the non-volatile resistance-based memory cell in response to the selected threshold voltage being a second threshold voltage; and
the sensor circuit configured to output a selected one or more logical signal based on a detected output signal and a selected threshold reference signal level.

2. The gate logic of claim 1, wherein the non-volatile resistance-based memory cell comprises: a plurality of reconfigurable non-volatile resistance-based junction circuits, each non-volatile reconfigurable resistance-based junction circuit being configured to receive an input logic signal; and an evaluation switch in series with the plurality of reconfigurable non-volatile resistance-based junction circuits, wherein the evaluation switch is configured to provide an output signal based on a configuration of resistance states of the plurality of reconfigurable non-volatile resistance-based junction circuits.

3. The gate logic of claim 2, wherein the evaluation switch is a one or more transistors in a selected combination of series and/or parallel.

4. The gate logic of claim 2, wherein the evaluation switch is a one or more reconfigurable non-volatile resistance-based junction circuits in the selected combination of series and/or parallel.

5. The gate logic of claim 2, wherein the evaluation switch is a one or more transistors and/or a one or more non-volatile reconfigurable resistance-based junction circuits in the selected combination of series and/or parallel.

6. The gate logic of claim 2, wherein the reconfigurable non-volatile resistance-based junction circuits comprise one or more of phase-change random access memory (PC-RAM) circuits, resistance-based random access memory (R-RAM) circuits, magnetoresistance random access memory (MRAM) circuits and spin transfer torque magnetoresistance tunnel junction MRAM (STT MTJ MRAM) circuits.

7. The gate logic of claim 6, wherein the STT MTJ MRAM circuit comprises:
a magnetic tunnel junction (MTJ); and
a first metal interconnect configured to provide a bit line write signal and/or an input read signal to the MTJ, wherein the bit line write signal configures a resistance state of the MTJ and the input read signal is applied to determine the resistance state.

8. The gate logic of claim 7, further comprising a switch operatively coupled to the MTJ and a source line to permit current to flow through the MTJ for a read and/or write operation.

9. The gate logic of claim 7, wherein the MTJ comprises:
a top electrode in communication with the metal interconnect;
a free magnetization layer adjacent to the top electrode;
a tunnel barrier layer adjacent to the free magnetization layer;
a fixed magnetization layer adjacent to the tunnel barrier; and
a bottom electrode adjacent the fixed magnetization layer in communication with the switch.

10. The gate logic of claim 2, wherein the evaluation switch comprises: a second metal interconnect in series communication with the plurality of reconfigurable non-volatile resistance-based junction circuits; and a switching element having a source electrode in communication with the second metal interconnect, a gate electrode configured to receive a control signal to change a resistance state of a conductive path of the switching element, and a source electrode, wherein the switching element is selected from at least a transistor, an MRAM cell and an STT MTJ MRAM cell.

11. The gate logic of claim 10, in which the sensor circuit is configured to detect the voltage at the second metal interconnect, and output the selected one or more logical signals based on the detected voltage and the selected threshold voltage.

12. The gate logic of claim 11, wherein the output signals of the sensor comprise a logical 1 and/or a logical 0.

13. The apparatus of claim 1, integrated into one of a cell phone, handheld personal communication system unit, portable data unit, personal digital assistant and meter reading equipment.

14. A write method of reconfiguring a non-volatile re-programmable gate logic comprising a non-volatile resistance-based memory cell, wherein the non-volatile resistance-based memory cell comprises a sensor circuit coupled to a plurality of reconfigurable non-volatile resistance-based junction circuits, each non-volatile reconfigurable resistance-based junction circuit being configured to receive a separate input logic signal, the method comprising:
applying a write input signal to each of the plurality of reconfigurable non-volatile resistance-based junction circuits, wherein a direction of current of the write input signal determines a resistance state of the non-volatile resistance-based junction circuit; and
controlling a threshold voltage of the sensor circuit, the threshold voltage determining a selected logic function of the non-volatile resistance-based memory cell from a plurality of selectable logic functions.

15. The write method of claim 14, further comprising selecting the direction of the write input signals to determine a set of resistance states of each reconfigurable non-volatile resistance-based junction circuit, the resistance states corresponding to the selected logic function.

16. The method of claim 14, further comprising integrating the non-volatile resistance-based memory cell into one of a cell phone, handheld personal communication system unit, portable data unit, personal digital assistant and meter reading equipment.

17. A method of operating a non-volatile re-programmable gate logic comprising a non-volatile resistance-based memory cell, wherein the non-volatile resistance-based memory cell comprises a plurality of reconfigurable non-volatile resistance-based junction circuits, the method comprising:
   applying a read input signal to each of the plurality of reconfigurable non-volatile resistance-based junction circuits, wherein the read input signal is less than a magnitude of a write input signal and too small to change a resistance state of the non-volatile resistance-based junction circuit;
   reading an output signal based on a configuration of resistance states of the plurality of non-volatile reconfigurable resistance-based junction circuits at an interconnection between the reconfigurable non-volatile resistance-based junction circuits and an evaluation switch;
   detecting the output signal by a sensor circuit operatively coupled to the interconnection, the sensor circuit receiving a selected threshold reference signal level, the selected threshold reference signal determining a selected logic function from a plurality of selectable logic functions; and
   outputting a selected one or more logical signals based on the detected output signal and the selected threshold reference signal level.

18. The method of claim 17, wherein the selected one or more logical signals comprise a logical 1 and/or a logical 0.

19. The method of claim 17, further comprising integrating the non-volatile resistance-based memory cell into one of a cell phone, handheld personal communication system unit, portable data unit, personal digital assistant and meter reading equipment.

20. A non-volatile re-programmable gate logic comprising:
   a non-volatile resistance-based memory cell comprising means for receiving a selected threshold voltage and means for outputting a first logical signal corresponding to a first logical functionality of the non-volatile resistance-based memory cell in response to the selected threshold voltage being a first threshold voltage, and means for outputting a second logical signal corresponding to a second logical functionality of the non-volatile resistance-based memory cell in response to the selected threshold voltage being a second threshold voltage.

21. The apparatus of claim 20, integrated into one of a cell phone, handheld personal communication system unit, portable data unit, personal digital assistant and meter reading equipment.

* * * * *